United States Patent [19]

Lee et al.

[11] 4,094,568
[45] June 13, 1978

[54] ELECTRICAL CROSSOVER AND TEST CONNECTORS

[75] Inventors: Laurence Saul Lee, New Hartford; Joseph Philip Roback, Utica, both of N.Y.

[73] Assignee: General Electric Company, Utica, N.Y.

[21] Appl. No.: 836,190

[22] Filed: Sep. 26, 1977

Related U.S. Application Data

[63] Continuation of Ser. No. 699,728, Jun. 24, 1976, abandoned.

[51] Int. Cl.² .............................................. H05K 1/07
[52] U.S. Cl. .......................... 339/17 LM; 339/150 B
[58] Field of Search .......... 339/17 LC, 17 LM, 17 M, 339/150 B, 151 B

[56] References Cited

U.S. PATENT DOCUMENTS

| | | | |
|---|---|---|---|
| 3,270,251 | 8/1966 | Evans | 339/17 LM |
| 3,413,594 | 11/1968 | Fernald et al. | 339/17 LC |

*Primary Examiner*—Neil Abrams

[57] ABSTRACT

Two types of connectors including a crossover connector and a test connector for a receptacle attached to two back-to-back planar circuitboards.

The receptacle includes a plurality of apertures containing metallic leads which are attached to terminals on both printed circuitboards.

One face of the crossover connector has a plurality of pins which are to be received into the apertures of the receptacle in order to connect any desired combination of terminals on the two printed circuitboards while simultaneously isolating the other terminals. The opposite face of the connector contains a plurality of apertures so that an electrical probe can have easy access to its interconnecting and isolating pins.

The test connector includes two subassemblies, the first of which is comprised of an insulated body containing pin structures similar to the isolating pin structure of the crossover connector except that it contains pins which extend from both faces of its body. The pins extending from one face are adapted to be received into the apertures of the receptacle and the pins extending from the opposite face are adapted to be received in and are attached within apertures of a second subassembly. The second subassembly is a printed wiring board that acts as an interface between the first subassembly and external test equipment. It is necessary because its wiring connections extend the distance between the pins from the first subassembly so as to make possible a plurality of connections to external test equipment as well as to facilitate the ease at which electrical probes can make contact with selected pins.

2 Claims, 6 Drawing Figures

ELECTRICAL CROSSOVER AND TEST CONNECTORS

This is a continuation, of application Ser. No. 699,728, filed Jun. 24, 1976, now abandoned.

BACKGROUND OF THE INVENTION

1. Field of the Invention

This invention pertains to electrical connectors, and more particularly to connectors for printed circuitboards which possess desirable programmability and testability features.

2. Description of the Prior Art

Printed circuitboard connectors, such as edge board connectors, have already been disclosed in the prior art, for example, in U.S. Pat. Nos. 2,875,425 and 3,131,017. However, edge board connectors are not suitable for use in many airborne military applications because they are susceptible to malfunctions when exposed to extreme environmental changes, e.g., vibrations and shocks. This is evidenced by the military specification which precluded their use, i.e., General Specification for Electronic and Airborne Equipment MIL-E-5400.

As a result, two-piece connectors have been fabricated that will satisfy the aforementioned military specification. The first piece of such connectors is a receptacle which can be attached to a double-sided circuitboard. The receptacle includes a plurality of apertures containing metallic leads which are attached to terminals on both sides of the printed circuitboard. The second piece of the connector is an insulated body containing a number of metallic elements including pins which extend to be received within the apertures of the receptacle in the manner described in U.S. Pat. No. 3,721,944. Once engaged within the receptacle the interconnections between the terminals on the two sides of the circuitboard are complete.

In military airborne signal processing equipment it is necessary to use two one-sided boards mounted back-to-back rather than one double-sided printed circuitboard. This is required so that the temperature of the circuit elements can be reduced either by convection by means of air forced between the boards or by conduction by means of a metallic heat sink placed between them. In such cases, the basic structure of the interconnection strip described in U.S. Pat. No. 3,721,944 can be used with such back-to-back boards but it would necessarily make connections between all terminals of the two boards.

Such connectors disclosed in the prior art are not suitable for many military applications where space and volume are at a premium. As circuit components have been fabricated in smaller sizes, more components are able to fit within the available space on any given circuitboard. The additional components have led to additional interconnections which have created a need for electrical connector with closer contact spacings. The prior art has developed receptacles with as little as .050 inch spacings between pins but such structures have not facilitated crossover connectors with such close spacing.

In certain military applications where performance is critical, testing is desired at frequent intervals and the speed with which a malfunction can be located may effect the success of the mission. The prior art does not offer adequate flexibility for efficiently testing a variety of connections between circuitboards. Neither does it provide adequate provisions for fault isolation when it becomes necessary to resolve the location of a malfunctioning device down to a few out of the hundreds of circuit components on two boards.

Accordingly, it is an object of the present invention to provide a crossover connector that will connect only a predetermined number of terminals from one circuitboard to those of the other board and at the same time provide a means for testing all of the terminals coming in contact with said crossover connector.

A further object is to provide a means for separating the circuits of two back-to-back bonded planar printed circuitboards in order to improve the fault isolation of the two boards.

It is a further object to provide a structure which will facilitate automatic testing.

SUMMARY OF THE INVENTION

The foregoing objects are achieved according to this invention through the provision of two different types of connectors which can be received within a receptacle that is attached to the edge of two back-to-back bonded planar printed circuitboards.

The receptacle includes leads extending from contact members within a plurality of apertures along its body to terminals located on each of the boards.

A first type of connector, referred to as a crossover connector, contains metallic pins mounted within its insulated body which are adapted to be received in apertures of the receptacle. The pins are constructed in two different configurations in order to accomplish an electrical connection (closed circuit) between a terminal on one board with that on another or to isolate (create an open circuit between) one terminal on one board from another on a second board. The combination of closed and open circuited pin structures within a crossover connector can be predetermined before the connector is fabricated.

A plurality of cross connectors can be constructed with different combinations of pin structures with each connector creating a different predetermined arrangement of closed and open circuits. Connectors so constructed offer a programmability feature because a variety of connectors can now be used to interconnect terminals of the two boards in different fashions. The crossover connector also has a plurality of recessed test points on the face of its insulating body that is opposite from the face from which the ends of the pins extend.

A second type of connector is a test connector which includes two subassemblies. The first subassembly functions to achieve electrical continuity to each of the terminals on the circuitboards while still isolating the terminals from one another. The first subassembly is comprised of an insulated body containing pin structures similar to the open circuited pin structure within the crossover connector except that it contains pins which extend from both faces of its body. The pins extending from one face are adapted to be received into the apertures of the receptacle and the pins extending from the opposite face are adapted to be received, and are attached within, apertures of a second subassembly.

The second subassembly is a printed wiring board that acts as an interface between the first subassembly and external test equipment. It contains printed wiring connections from the apertures on its surface which are attached to the pins from the first subassembly to other apertures along its edge upon which leads from external test equipment can be attached. The printed wiring connections act to extend the distance between the pins from the first subassembly so as to provide a two-fold advantage. First, it is now easier to insert test probes at any pin location without risking the possibility of making contact with any other nearby pin. Second, it is easier to affix leads onto the second subassembly from external test equipment which can be programmed to provide a plurality of interconnections.

BRIEF DESCRIPTION OF THE DRAWINGS

Various other objects, features and attendant advantages of the present invention will be more fully appreciated from the following detailed description when considered in connection with the accompanying drawings.

DESCRIPTION OF THE PREFERRED EMBODIMENT

Figure 1:
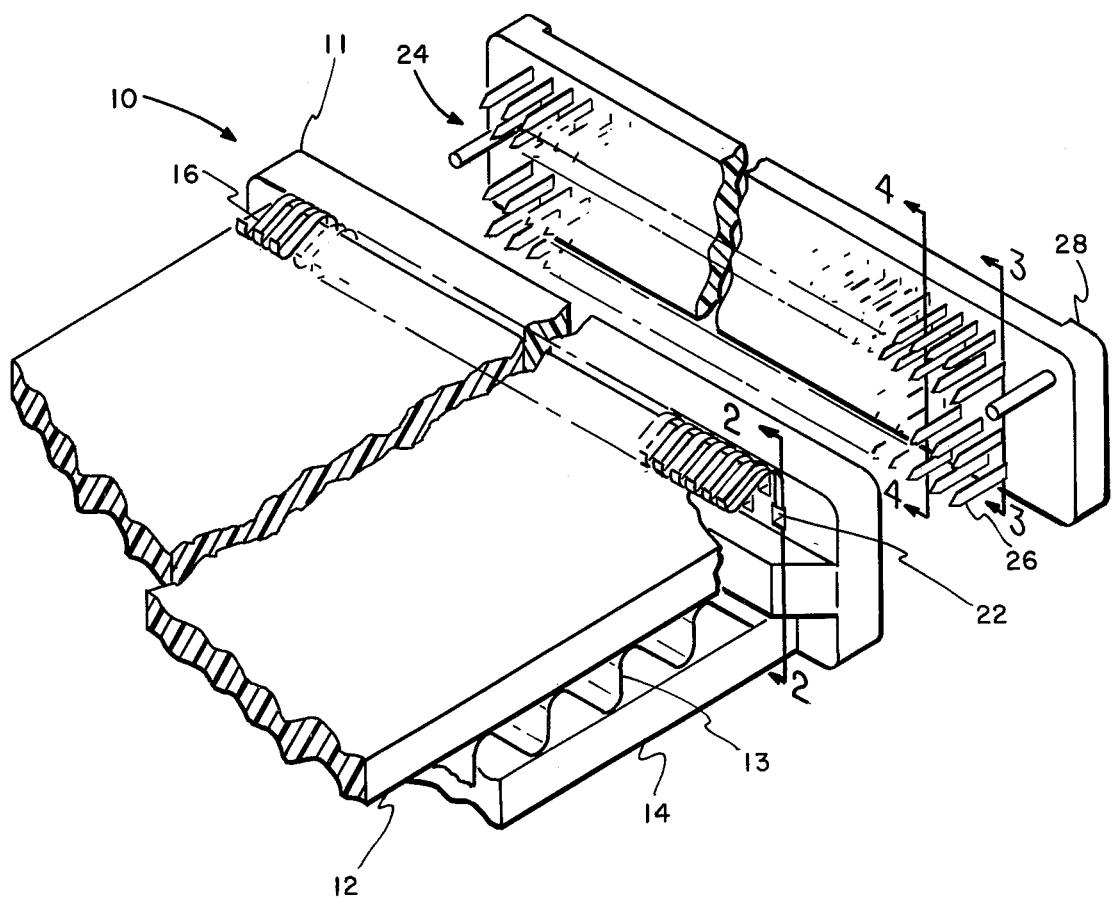
FIG. 1 is a view of the receptacle showing a portion of two circuitboards with a receptacle attached thereto and illustrates, above the receptacle, a crossover connector constructed according to the present invention.
Figure 2:
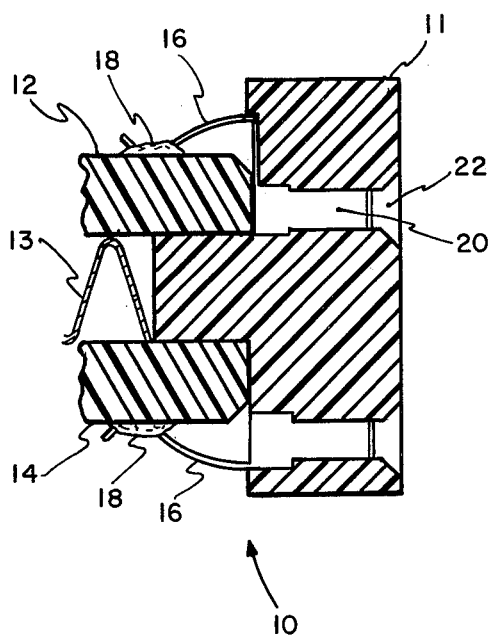
FIG. 2 is a sectional view taken on section line 2—2 of FIG. 1.

Referring now to the drawings, and more specifically to FIGS. 1 and 2 thereof, there is shown generally a receptacle attached to the edges of two back-to-back planar printed circuitboards 12 and 14. Circuitboards 12 and 14 are bonded to a corrugated metal heat sink element 13. The receptacle includes an elongated body 11 composed of a suitable insulating material, such as glass filled nylon. A plurality of electrical connections are made from the exposed sides of boards 12 and 14 via leads 16 extending from terminals 18 on boards 12 and 14 to contact members 20 positioned inside apertures 22 of receptacle body 11. While not shown in the section view of FIG. 2, the successive spring contacts 20 arranged longitudinally on body 11 of receptacle 10 include spring contact elements facing one another which are adapted to receive a pin therebetween.

In order to provide connection or isolation in any desired manner between the circuits of the circuitboards 12 and 14 a crossover connector 24 is provided. This connector 24 includes an elongated body 28 formed of a suitable insulating material, such as glass filled nylon. The body 28 includes two elongated grooves 46 extending the length of each of its elongated sides in order to provide grooved areas for an extractor tool. A suitable extractor tool (not shown) is a plier-like device constructed with gripping ends adapted to fit into grooves 46, so that the crossover connector can be easily extracted from receptacle 10 when it is desired to replace one crossover connector with another.

A plurality of pins are anchored within and extend from one face of body 28. These pins are spaced so as to be received in engagement with corresponding contact members 20 positioned within apertures 22 in receptacle body 11.

Figure 3:
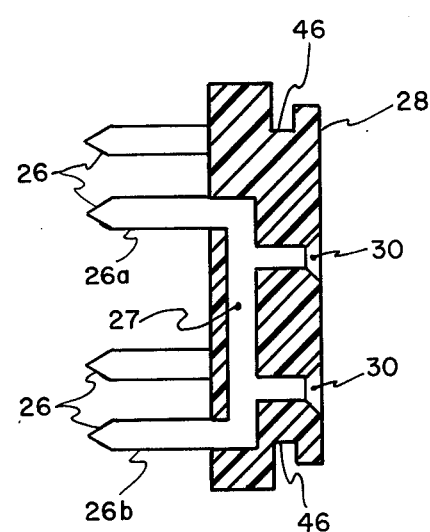
FIG. 3 is a sectional view taken on section line 3—3 of FIG. 1.
Figure 4:
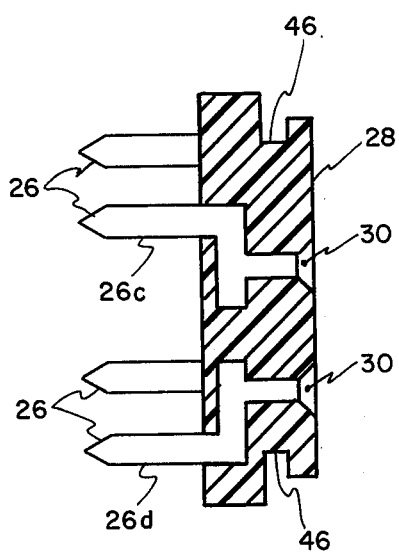
FIG. 4 is a sectional view taken on section line 4—4 of FIG. 1.

Referring to FIGS. 3 and 4 it can be seen that two configurations are employed internally of the body 28. The configuration shown in FIG. 3 provides a conductive element 27 interconnecting pins identified as 26a and 26b. Pin 26a is adapted to be connected through the receptacle 10 to a circuit in board 12 and pin 26b is adapted to be connected to a circuit in board 14. Conversely, in the configuration of FIG. 4, pin 26c is insulated from pin 26d, that is, no electrical connection is provided therebetween because there is no internal conductive element 27 connecting these pins. Thus, the circuit of board 12 with which the pin 26c is connected through the receptacle 10 is isolated from the circuit in board 14 to which the pin 26d is connected. The portion of the metallic structure within body 28 between pins 26c and 26d functions as an anchoring element because if pin 26c and 26d in FIG. 4 were to run straight through body 28, they would not have as much structural support as they have in this preferred embodiment.

In order to facilitate access for an electrical probe, tapered circular indentations 30 on the opposite face of the body 28 extend below its surface to the top metal edges of pin 26 as shown in FIGS. 3 and 4. Indentations 30 allow electrical measurements to be taken at the same time as continuity is preserved through the two circuitboards between the desired terminals 18 when the crossover connector 24 is received into receptacle 10.

The crossover connector 24 can be fabricated with any predetermined combination of pins which will selectively make connections between (first configuration for a closed circuit pin structure shown in FIG. 3) or isolate (second configuration for an open circuit pin structure shown in FIG. 4) the terminals of circuitboards 12 and 14.

Not only does each crossover connector 24 allows one to choose the order of connections between circuit boards 12 and 14 by a priori selecting a particular combination of open and closed pin structure within a crossover connector, but by utilizing a plurality of crossover connectors with different internal configurations, a programmability feature is attained. This feature allows the terminals 18 on printed circuitboards 12 and 14 to be interconnected in a number of different predetermined fashions equal to the number of crossover connectors 24. In this way each predetermined crossover connector 24 makes its unique combination of predetermined programmed connections between the terminals 18 of printed circuitboards 12 and 14. For example, if it is desired to make a connection on every fifth terminal 18 between boards 12 and 14, every fifth pin 26 within body 28 would have the closed circuit pin structure of FIG. 3, whereas all other pins would have the open circuit pin structure shown in FIG. 4.

Substantial programmability can be obtained by using several different crossover connectors each having a different internal arrangement of the pin structure configurations shown in FIGS. 3 and 4. Thus, for example, in lieu of every fifth pin being a closed circuit structure, another crossover connector can be fabricated so as to make a connection between every fourth terminal 18 of the two boards. A crossover connector with every fourth pin 26 within body 28 having a closed circuit structure as in FIG. 3 while all other pins have the open circuit structure of FIG. 4 would accomplish a connection between every fourth terminal 18.

Figure 5:
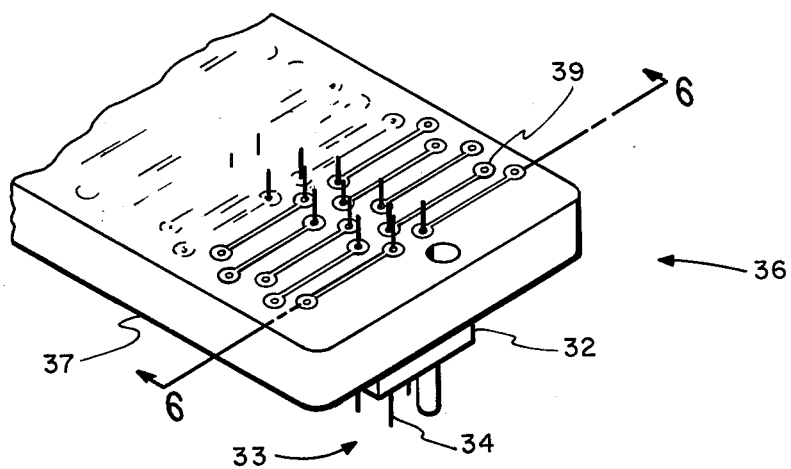
FIG. 5 is a view of a test connector constructed according to the present invention.
Figure 6:
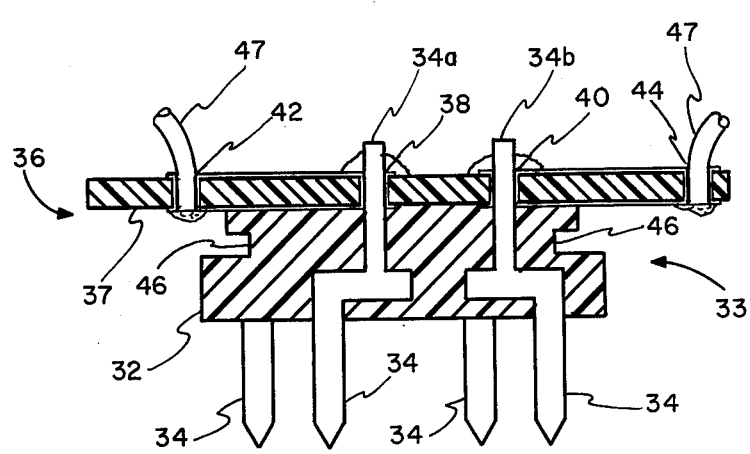
FIG. 6 is a sectional view taken on section line 6—6 of FIG. 5.

In FIGS. 5 and 6 there is shown a test connector 36 which can be utilized in order to make a plurality of connections from terminals 18 of circuitboards 12 and 14 to external test equipment. Test connector 36 includes two subassemblies, one of these is component 33 and the other is interfacing printed wiring board 37.

The function of component 33 is to connect terminals 18 to board 37 while still isolating terminals 18 of board 12 from those of board 14. Component 33 includes an elongated body 32 composed of a suitable insulating material such as glass filled nylon, with a plurality of pins 34 anchored within and extending from both faces of body 32. Body 32 is identical to body 28 shown in FIGS. 3 and 4. The pins extending from one face of body 32 are adapted to be received into the apertures 22 of receptacle 10. The internal structure of all pins 34 are similar to the configuration of the open circuit pin structure shown in FIG. 4 except that pins 34 continue to extend out of the opposite face of body 32 as shown in FIG. 6. Pins 34 extending on the opposite face of body 32 are adapted to be received in and are attached to the apertures 38 and 40 within interfacing printed wiring board 37.

The function of interfacing printed wiring board 36 is to extend the distance between pins 34a and 34b as shown in FIG. 6 so that electrical connections from external test equipment can be more easily made.

Interfacing printed wiring board 36 includes an elongated body 37, a plurality of apertures 42 and 44 in addition to apertures 38 and 40, a plurality of conductive runs 39 extending on the top and bottom faces of body 37 from apertures 38 to apertures 42 and from apertures 40 to apertures 44.

The second group of apertures 42 and 44 separated a greater distance than apertures 38 and 40 offer two distinct advantages. First, it is now easier to insert electrical test probes to the connections of interest without risking the possibility of making contact with two different pins and thereby creating a short circuit between two such pins which could result in a failure of circuit components. Secondly, it is easier to affix leads 47 to the extended apertures 42 and 44 which can be connected to external test equipment which may be programmed to provide a plurality of connections.

Whenever interconnections are desired between pins on test connector 36 they can either be accomplished on the test connector itself by interconnecting selected pins 34 extending through apertures 38 and 40 or interconnecting leads between apertures 42 and 44 or by interconnecting the leads which extend from apertures 42 and 44 internally within the external test equipment.

Crossover connector 24 and test connector 36 are desirable in military applications where the performance of complex circuitry is critical. In such applications, testing is desired at more frequent intervals than in commercial applications.

The crossover connector allows an electrical probe access to all of its pin connections corresponding to terminals 18 of boards 12 and 14. Additional testing in a similar manner can be accomplished utilizing a plurality of different crossover connectors when such testing involving different combinations of interconnections is desired.

The test connector can be used quite advantageously with test and signal probes affixed to apertures 42 and 44 and connected to external test equipment. In this manner selected terminals 18 of circuitboards 12 and 14 can accept test signals while the response of other terminals 18 can be monitored.

The test connector is not only utilized very effectively in carrying out manual testing procedures but is of paramount importance in automatic testing. The test connector is well suited to accept signals from external test equipment that automatically provides selected terminals 18 with signals that will stimulate the circuitry located on circuitboards 12 and 14 in such a fashion as to completely exercise all circuits of interest.

In many airborne military applications where space is at a premium, circuit components are mounted in circuitboards in the densest possible configuration. It is not uncommon for over a hundred circuit components in the structure of flat packs to be mounted on each printed circuitboard 12 and 14. For example, a particular printed circuitboard in use today has 168 possible locations for flat packs available on each board. Whenever a malfunction is experience it is necessary to isolate the inoperative device down to only a few flat packs out of the several hundred that are present on the two circuit boards 12 and 14. On the particular circuitboards aforementioned in the example, test connector 36 is particularly effective in isolating malfunctions down to 5 out of the 168 flatpacks on each printed circuitboard 12 or 14.

It can now be appreciated from the above discussion that the structures shown in FIGS. 5 and 6 do provide for a test connector 36 that can be utilized to facilitate automatic testing as well as to isolate faults down to a very narrow region of flatpacks on the circuitboards 12 and 14 with an efficiency and manner that was previously unattainable.

What is claimed as new and desired to be secured by Letters Patent of the United States is:

1. A circuit board connection assembly, comprising:
   a first circuit board 12 having a first margin along which are fixed a first plurality of spaced apart contacts;
   a second circuit board 14 having a second margin along which are fixed a second plurality of spaced apart contacts;
   means 13 fixing said first and second boards together in a spaced apart, parallel relationship with said first and second margins adjacent each other;
   a receptacle body having
   a first portion interlocked with said first and second boards;
   a second portion having
   a first and a second face, said first face being adjacent said boards and said second face being remote from said boards,
   a first plurality of transverse bores, each extending between said faces and having a progressive enlargement onto said second face, disposed alternately in an upper and a lower row, parallel to each other, and adjacent said first margin of said first board,
   a second plurality of transverse bores, each extending between said faces and having a progressive enlargement onto said first face, disposed alternately in an upper and a lower row, parallel to each other, and adjacent said second margin of said second board,
   said upper rows being spaced apart by a given distance,
   said lower rows being spaced apart by said given distance,
   a first plurality of contact elements 20, each disposed in a respective one of said upper and lower rows of said first plurality of bores, each contact element having a female portion disposed in said respective bore but not in said progressive enlargement thereof, and having a lead portion 16 extending from said respective bore through said first face to a respective one of said first contacts of said first board, a second plurality of contact elements, each disposed in a respective one of said upper and lower rows of said second plurality of bores, each contact element having a female portion disposed in said respective bore but not in said progressive enlargement thereof, and having a lead portion extending from said respective bore through said first face to a respective one of said second contacts of said second board, a cross-over connector body 24 having a first face and a second face, said first face disposed adjacent said second face of said connector body and said second face remote therefrom, a first plurality of transverse bores extending inwardly and having a progressive decrement from said second face of said connector body, disposed alternately in an upper and a lower row, parallel to each other, a second plurality of transverse bores extending inwardly and having a progressive decrement from said second face of said connector body, disposed alternately in an upper and a lower row, parallel to each other, a third plurality of contact elements each communicating with a respective one of said upper and lower rows of said first plurality of bores of said connector body and passing through said first face of said connector body and through said second face of said receptacle body into the female portion of a respective one of said first plurality of contact elements of said receptacle body, a fourth plurality of contact elements, each communicating with a respective one of said upper and lower rows of said second plurality of bores of said connector body and passing through said first face of said connector body and through said second face of said receptacle body into the female portion of a respective one of said second plurality of contact elements of said receptacle body, said third and fourth pluralities of contact elements thereby forming an array of rows and columns wherein each column contains two contact elements, a plurality of conductive elements 27 disposed within said connector body in predetermined ones, but not all, of said columns, electrically connecting the respective third contact element of said one column with the respective fourth contact element of said one column.

2. A circuit board connection assembly, comprising:

a first circuit board 12 having a first margin along which are fixed a first plurality of spaced apart contacts 18;

a second circuit board 14 having a second margin along which are fixed a second plurality of spaced apart contacts;

means 13 fixing said first and second boards together in a spaced apart, parallel relationship with said first and second margins adjacent each other;

a receptacle body having a first portion interlocked with said first and second boards;

a second portion having a first and a second face, said first face being adjacent said boards and said second face being remote from said boards, a first plurality of transverse bores, each extending between said faces and having a progressive enlargement onto said second face, disposed alternately in an upper and a lower row, parallel to each other, and adjacent said first margin of said first board, a second plurality of transverse bores, each extending between said faces and having a progressive enlargement onto said first face, disposed alternately in an upper and a lower row, parallel to each other, and adjacent said second margin of said second board, said upper rows being spaced apart by a first given distance, said lower rows being spaced apart by said first given distance, a first plurality of contact elements 20, each disposed in a respective one of said upper and lower rows of said first plurality of bores, each contact element having a female portion disposed in said respective bore but not in said progressive enlargement thereof, and having a lead portion 16 extending from said respectively bore through said first face to a respective one of said first contacts of said first board, a second plurality of contact elements, each disposed in a respective one of said upper and lower rows of said second plurality of bores, each contact element having a female portion disposed in said respective bore but not in said progressive enlargement thereof, and having a lead portion extending from said respective bore through said first face to a respective one of said second contacts of said second board, an intermediate connector body 24 having a first face and a second face, said first face disposed adjacent said second face of said connector body and said second face remote therefrom, a third plurality of contact elements, each transversely fixed in said connector body and having a first portion extending through said first face of said connector body and through said second face of said receptacle body into the female portion of a respective one of said first plurality of contact elements of said receptacle body, and having a second portion projecting from said second face of said connector body;

a fourth plurality of contact elements, each transversely fixed in said connector body and having a first portion extending through said first face of said connector body and through said second face of said receptacle body into the female portion of a respective one of said second plurality of contact elements of said receptacle body, and having a second portion projecting from said second face of said connector body;

a spacer connector body 36 having a fifth plurality of contact elements 42 disposed alternately in an upper and a lower row, parallel to each other, a sixth plurality of contact elements 44 disposed alternately in an upper and a low row, parallel to each other, said upper rows being spaced apart by a second given distance, said lower rows being spaced apart by said second given distance, said second given distance being greater than said first given distance,
a seventh plurality of conductive elements, each fixed to said spacer connector body, each electrically connecting a respective one of said fifth plurality of contact elements with a respective second portion of a respective third plurality of contact elements;
an eighth plurality of conductive elements, each fixed to said spacer connector body, each electrically connecting a respective one of said sixth plurality of contact elements with a respective second portion of a respective fourth plurality of contact elements.

* * * * *